United States Patent [19]
Kwon

[11] Patent Number: 5,844,285
[45] Date of Patent: Dec. 1, 1998

[54] BODY CONTACT STRUCTURE FOR SEMICONDUCTOR DEVICE

[75] Inventor: Oh-Kyong Kwon, Seoul, Rep. of Korea

[73] Assignee: LG Semicon Co., Ltd., Cheongju, Rep. of Korea

[21] Appl. No.: 810,135

[22] Filed: Feb. 25, 1997

[30] Foreign Application Priority Data

Feb. 28, 1996 [KR] Rep. of Korea ................... 1996/5010

[51] Int. Cl.⁶ .................................................. H01L 29/417
[52] U.S. Cl. ........................ 257/401; 257/901; 257/773; 257/774
[58] Field of Search .................... 257/372, 373, 257/375, 377, 401, 773, 901, 774, 394

[56] References Cited

U.S. PATENT DOCUMENTS 5,185,275 2/1993 Prall ........................................ 257/375
5,563,438 10/1996 Tsang ...................................... 257/373

*Primary Examiner*—John Guay
*Attorney, Agent, or Firm*—Fleshner & Kim

[57] ABSTRACT

An improved body contact structure for a semiconductor device which is capable of forming a contact portion by using less surface area, obtaining a constant contact surface ratio between a source region and a body contact diffusion layer even when a contact is misaligned, and preventing the activation of a parasitic device, whereby it is possible to enable a stable operation of the device. The body contact structure for a semiconductor device includes a conductive substrate, first and second parallel conductive source regions, a bar-shaped conductive body contact diffusion layer formed in an extended source region and split by the extended source region into multiple portions, and cubic-shaped contact wiring metal layers formed so that each body contact diffusion layer portion is connected with a neighboring body contact diffusion layer portion and the extended source region formed between the neighboring body contact diffusion layer portions.

12 Claims, 5 Drawing Sheets

BODY CONTACT STRUCTURE FOR SEMICONDUCTOR DEVICE

BACKGROUND OF THE INVENTION

1. Field of the Invention

The present invention relates to a body contact structure for a semiconductor device, and in particular to an improved body contact structure for a semiconductor device which is capable of forming a contact portion by using less surface area, obtaining a constant contact surface ratio between a source region and a body contact diffusion layer even when a contact is misaligned, and preventing the activation of a parasitic device, whereby it is possible to enable a stable operation of the device semiconductor.

2. Description of the Conventional Art

Generally, when fabricating semiconductor devices, a parasitic device is inevitably fabricated.

This parasitic device becomes activated under a specific condition and degrades the characteristics of the device. So, it is important to eliminate the operational conditions of such parasitic devices.

The conventional method of eliminating the above-described operational conditions of the parasitic devices will now be explained with reference to the accompanying drawings.

FIG. 1A is a cross-sectional diagram illustrating a conventional body contact structure of an NMOSFET, and FIG. 1B is an equivalent circuit diagram illustrating a conventional body structure of an NMOSFET.

As shown therein, the conventional NMOSFET includes a P-type substrate 11 including a channel region 12, a gate oxide film and gate electrode 18 formed on the channel region 12, an $N^+$ type drain region 13, an $N^+$ type source region 14, a $P^+$ type body contact diffusion layer 15 contacting with the $N^+$ type source region 14, and a source electrode 17 formed on the $N^+$ type source region 14 and the $P^+$ type body contact diffusion layer 15, for thus connecting both the $N^+$ type source region 14 and the $P^+$ type body contact diffusion layer 15. In the drawings, reference numeral 16 denotes a P-type substrate region of the P-type substrate 11, which P-type substrate region 16 contacts with the $N^+$ type source region 14 and the $P^+$ type body contact diffusion layer 15.

In addition, in the above-described conventional NMOSFET, a parasitic NPN bipolar junction transistor (BJT) is formed on the surface of the device.

In this BJT device, the drain region 13 of the NMOSFET, the channel region 12 of the substrate 11, and the source serve as the collector C, the base B, and the emitter E, respectively. If there is a predetermined electric potential difference between the base B of the channel region 12 and the emitter E of the source region 14 (or the body contact diffusion layer 15), the BJT device becomes activated, causing a current to flow to the emitter E through the base B irrespective of the voltage of the gate 18 of the NMOSFET.

In addition, a small amount of current flows from the base E of the channel region 12 to the body contact diffusion layer 15 through the P-type substrate region 16 contacting with the emitter 14 formed by source region and the body contact diffusion layer 15. The higher the resistance of the substrate region 16, the more voltage drop in the flowing path of the current which flows from the base B of channel region to the body contact diffusion layer 15 through the P-type substrate region 16. At this time, if the voltage drop reaches a predetermined level which is capable of activating the base B of channel region 12 and the emitter E of source region 14 of the parasitic BJT, the parasitic BJT device becomes activated, so that the current starts to flow, irrespective of the voltage being supplied to the gate 18.

Therefore, in order to prevent the activation of the BJT device, it is necessary to prevent the voltage from being supplied to the base B of channel region 12 and the emitter E of source region 14 of the parasitic BJT device. The body contact diffusion layer 15 is made deeper, for thus minimizing the resistance of the substrate region 16 and preventing the activation of the parasitic BJT device, whereby it is possible to increase the safe operation area.

The above-described body contact diffusion layer 15 serves to effectively prevent the activation of the parasitic device; however, the area in which another device is to be formed is increased due to the increased area of the body contact diffusion layer 15, for thus decreasing the efficiency of the area usage and disadvantageously increasing the conduction resistance per unit area of the device.

Therefore, it is needed to fabricate a narrow and deep body contact diffusion layer in order to prevent the activation of the parasitic BJT device as well as the characteristic degradation of the semiconductor device.

Another method was disclosed as follows in order to implement the above-described techniques.

FIG. 2A is a schematic perspective view illustrating a conventional body contact structure of an NMOSFET, and FIG. 2B is a layout view illustrating the conventional body contact structure of an NMOSFET.

As shown therein, the conventional body contact structure includes a substrate 21 having parallel source diffusion layers 23 and 24 formed therein, a bar-shaped body contact diffusion layer 22 longitudinally formed between the source diffusion layers 23 and 24, and a lengthy cubic-shaped contact wiring metal layer 25 formed on the body contact diffusion layers 22 and 23 and partially on the source diffusion layers 23 and 24, whereby contact portions can be formed in the body contact diffusion layer 22 and the source diffusion layers 23 and 24 in order for the body contact diffusion layer 22 and the source diffusion layers 23 and 24 to be commonly connected.

However, in the above-described construction, the contact wiring metal layer 25 formed on the body contact diffusion layer 22 and the source regions 23 and 24 must contact with a contact portion of the source regions 23 and 24 by a predetermined width. In addition, the contact wiring layer 25 must partially contact with the source regions 23 and 24 by a predetermined width.

For example, when determining the minimum size of λ, the minimum size of the contact wiring layer 25 is determined by "λ×λ", and the minimum widths of the region 27 in which the contact wiring layer 25 is formed and the region 28 in which the contact wiring layer 25 is not formed are ¼λ, respectively, so the widths of the source regions 23 and 24 including the body contact diffusion layer 22 which is longitudinally formed along the channel must be 3/2λ, namely, the widths are 1.5 times the minimum width.

In addition, if a contact hole pattern is misaligned due to an error which occurs when aligning a contact mask on the substrate in one of the source regions 23 and 24, since the region 28 in which the contact wiring layer 25 is not formed has a width less than the minimum width (¼λ), the MOSFET source regions 23 and 24 do not form a desired body contact.

As a result, since the width must be determined based on the above-described conditions, the entire area (or the width)

of the source regions 23 and 24 including the body contact diffusion layer 22 is disadvantageously increased.

FIG. 3A is a schematic perspective view illustrating another conventional body contact structure of an NMOSFET directed to overcoming the above-described problems, and FIG. 3B is a layout view illustrating this conventional body contact structure of an NMOSFET.

As shown therein, the body contact structure includes parallel $N^+$ type source regions 33 and 34 formed in a P-type substrate 31 along a channel region, and a $P^+$ type body contact diffusion layer 32 formed between the $N^+$ type source regions 33 and 34. Here, the $P^+$ type body contact diffusion layer 32 is split into multiple portions by the $N^+$ type source regions 36 which extend between the $N^+$ type source regions 33 and 34, respectively.

Namely, since the $N^+$ type source region 36 and the $P^+$ type body contact diffusion layer 32 are alternately formed in the P-type substrate 31, a contact hole 35 does not accurately contact with the $P^+$ type body contact diffusion layer 32 and the $N^+$ type source region 36. Even when the contact hole 35 is misaligned, the area of the center portion thereof is made constant, for thus overcoming the problems of the body contact.

Therefore, the widths "λ" of the source regions 33 and 34 including the body contact diffusion layer 32 are obtained, so that it is possible to obtain a minimum width based on a design rule.

However, as shown in FIGS. 2A through 3B, if the contact hole is formed in a straight bar shape, the contact holes of the remaining devices are formed in a square shape. Since the etching ratios during the formation of the contact hole are different, a small size contact hole region is first etched, and a large size contact hole region is etched later. Therefore, when forming the contact hole, if the etching is performed mainly with respect to the body contact region, the other contact regions are etched more. On the contrary, if the etching is performed mainly with respect to the other contact regions, the body contact region is not etched substantially.

SUMMARY OF THE INVENTION

Accordingly, it is an object of the present invention to provide a body contact structure for a semiconductor device which overcomes the aforementioned problems encountered in the conventional art.

It is another object of the present invention to provide an improved body contact structure for a semiconductor device which is capable of forming a contact portion by using less surface area, obtaining a constant contact surface ratio between a source region and a body contact diffusion layer even when a contact is misaligned, and preventing the activation of a parasitic device, whereby it is possible to enable a stable operation of the device.

To achieve the above objects, there is provided a body contact structure for a semiconductor device which includes a first conductive substrate, first and second parallel conductive source regions, a bar-shaped conductive body contact diffusion layer formed in a source region and split by extended source regions into multiple portions, and cubic-shaped contact wiring metal layers formed so that each body contact diffusion layer portion is connected with neighboring body contact diffusion layer portions and the extended source region formed between the neighboring body contact diffusion layer portions.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1A:
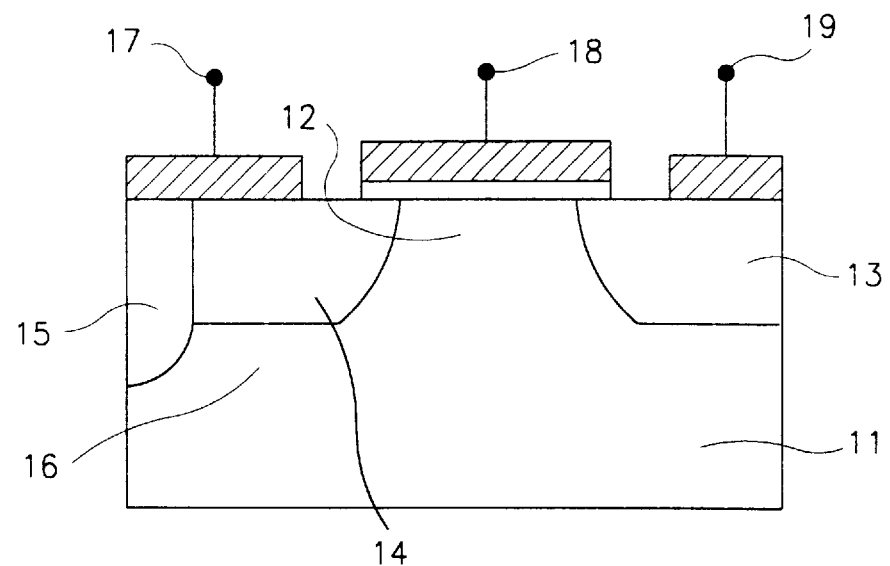
FIG. 1A is a cross-sectional diagram illustrating a conventional body contact structure of an NMOSFET.
Figure 1B:
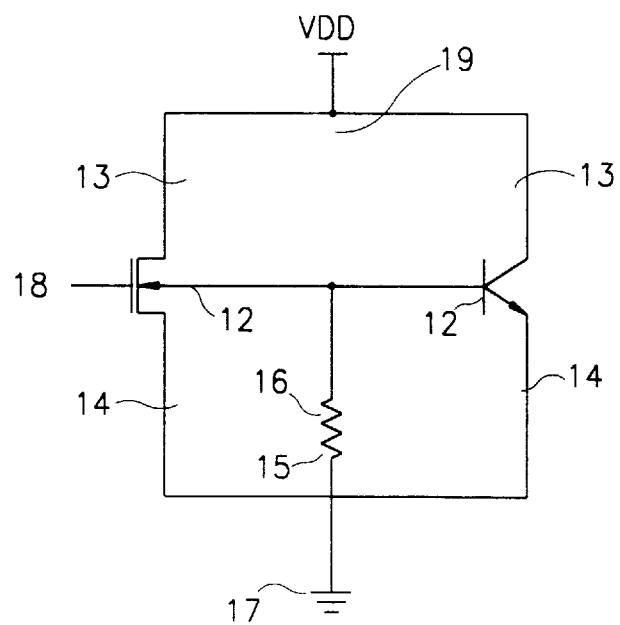
FIG. 1B is an equivalent circuit diagram illustrating the conventional body structure of the NMOSFET.
Figure 2A:
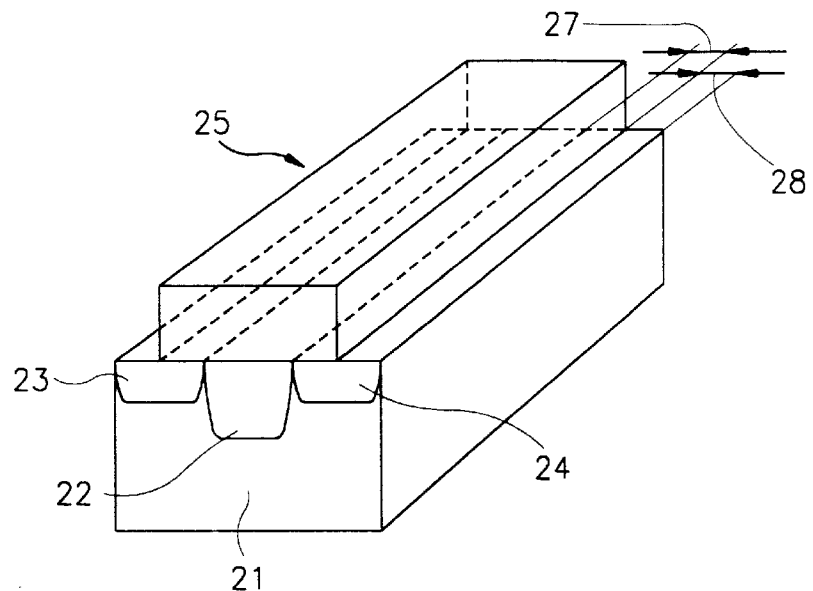
FIG. 2A is a schematic perspective view illustrating the conventional body contact structure of an NMOSFET.
Figure 2B:
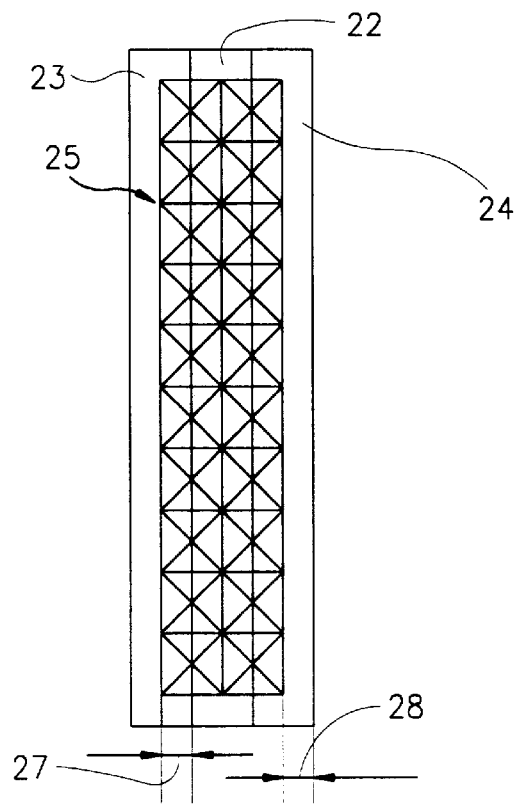
FIG. 2B is a layout view illustrating the conventional body contact structure of an NMOSFET.
Figure 3A:
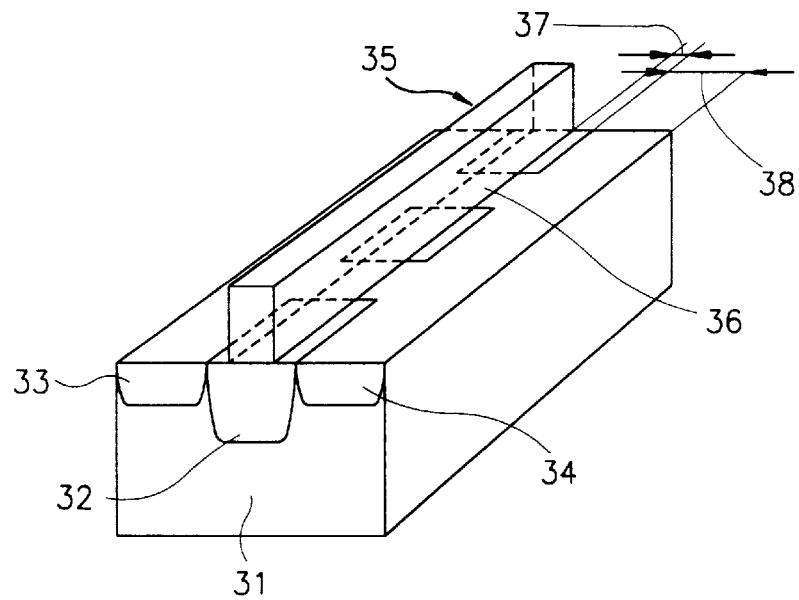
FIG. 3A is a schematic perspective view illustrating another conventional body contact structure of an NMOSFET.
Figure 3B:
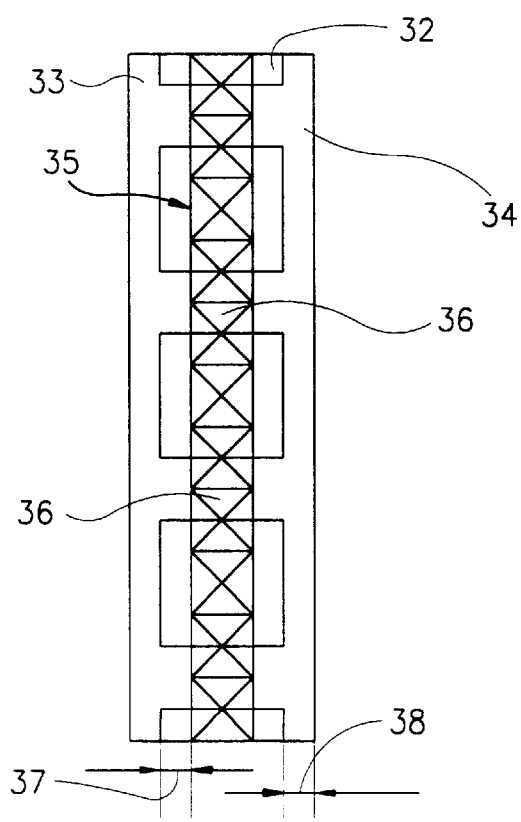
FIG. 3B is a layout view illustrating such other conventional body contact structure of an NMOSFET.
Figure 4A:
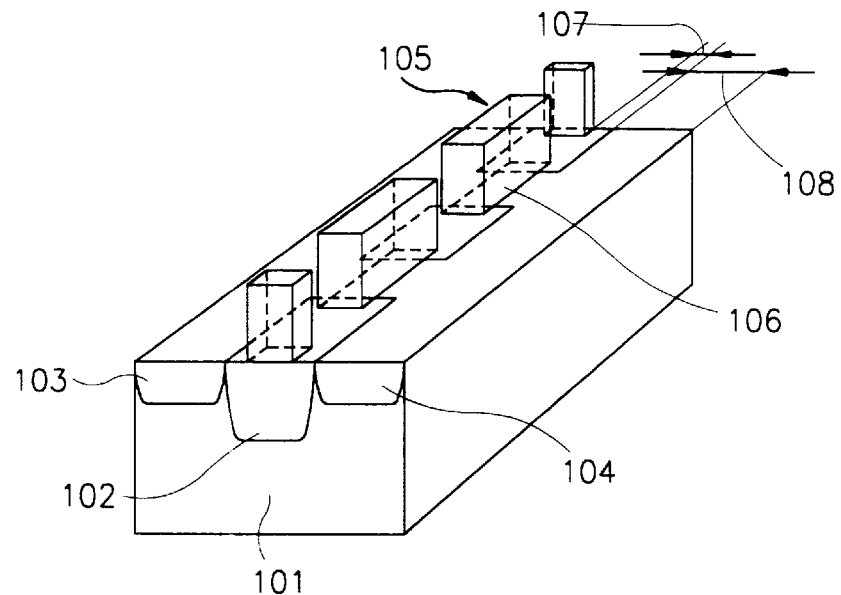
FIG. 4A is a schematic perspective view illustrating a body contact structure of an NMOSFET according to a first embodiment of the present invention.
Figure 4B:
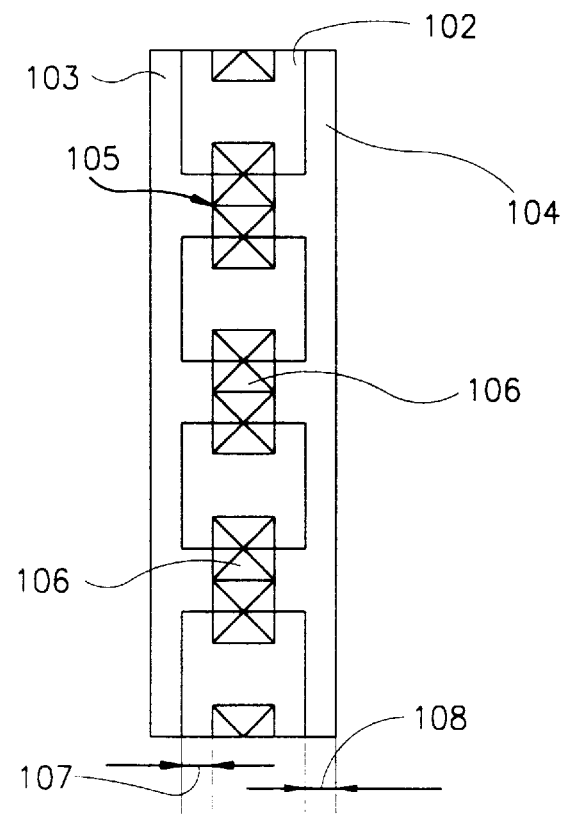
FIG. 4B is a layout view illustrating the body contact structure of an NMOSFET according to the first embodiment of the present invention.

FIG. 4A is a schematic perspective view illustrating a body contact structure of an NMOSFET according to a first embodiment of the present invention, and FIG. 4B is a layout view illustrating the body contact structure of an NMOSFET according to the first embodiment of the present invention.

As shown therein, in the upper portion of a P-type substrate 101, a P-type body contact diffusion layer 102 is spacedly split by $N^+$ type extended source regions 106 into multiple portions. Parallel $N^+$ type source regions 103 and 104 are formed at both sides of the P-type body contact diffusion layer portion 102. A contact wiring metal layer 105 is formed on each $N^+$ type source region 106 and partially on neighboring portions of the P-type body contact diffusion layer portion 102, respectively, whereby the $P^+$ type body contact diffusion layers 102 and the $N^+$ type source regions 106 formed therebetween are commonly connected.

With the above-described body contact structure, it is possible to form a contact by using less area. In addition, even when the contact region is misaligned, the contact area ratio between the source region and the PN junction of the body contact diffusion layer, namely, the ratio between the source contact area and the body contact area, becomes 1:1.

In addition, since the contact wiring region is formed to be square in shape, and the contacting area between the contact wiring region and the body contact diffusion layer is small, the etching ratio becomes similar to that for the contact structures with the other regions.

Figure 5A:
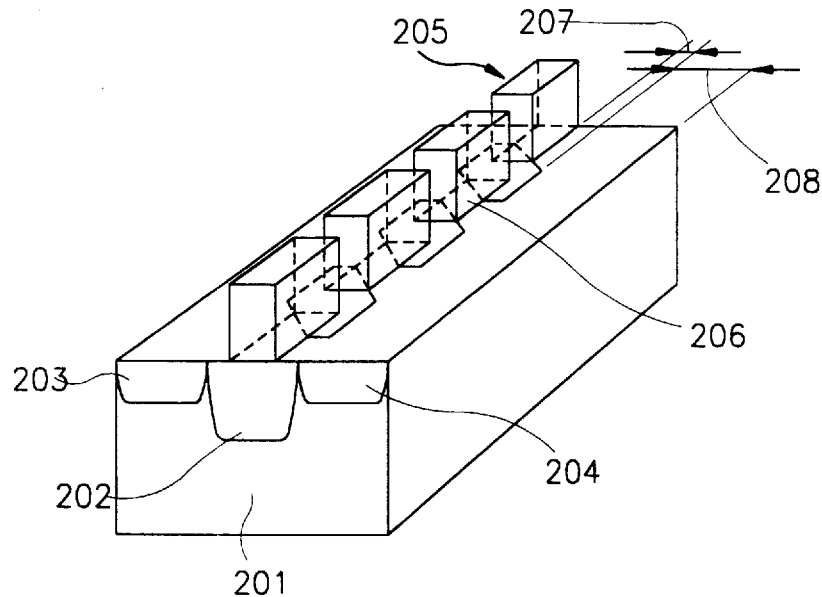
FIG. 5A is a schematic perspective view illustrating a body contact structure of an NMOSFET according to a second embodiment of the present invention.
Figure 5B:
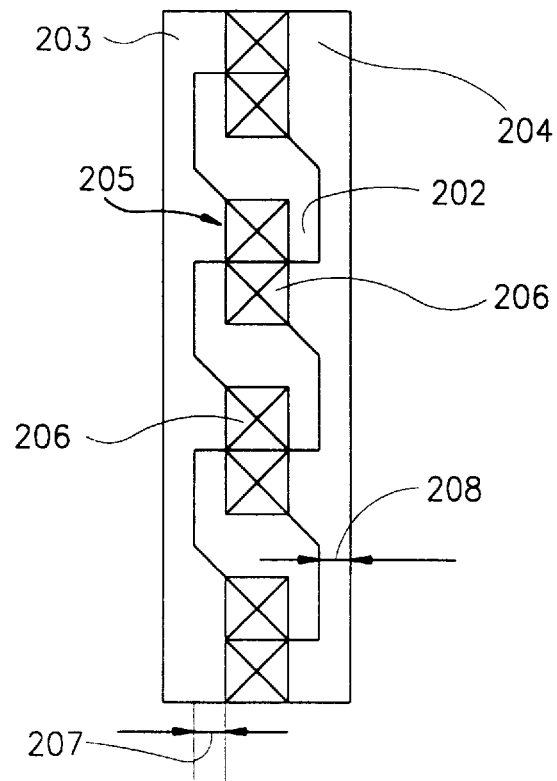
FIG. 5B is a layout view illustrating the body contact structure of an NMOSFET according to the second embodiment of the present invention.

FIG. 5A is a schematic perspective view illustrating a body contact structure of an NMOSFET according to a second embodiment of the present invention, and FIG. 5B is a layout view illustrating the body contact structure of an NMOSFET according to the second embodiment of the present invention.

As shown therein, the body contact structure according to the second embodiment of the present invention includes N+ type source regions 203 and 204 formed in a P-type substrate 201, a P+ type body contact diffusion layer 202, which is spacedly split into multiple portions and is formed in the N+ type source regions 203 and 204, and a contact wiring metal layer 205, which is spacedly split into multiple portions and is formed so that the P+ type body contact diffusion layer portions 202 are commonly connected with the neighboring P+ type body contact diffusion layer portions 202 and the N+ type extended source region 206 formed therebetween.

Here, the end portions of the body contact diffusion layer 202 are vertically and longitudinally chopped off with respect to the source regions 203 and 204 so that the body contact diffusion layer 202 does not have a sharp edge portion.

Identically to the first embodiment of the present invention, the above-described body contact structure is formed by using only a small area, and even when the contact is misaligned, the contact area ratio between the source region and the PN junction of the body contact diffusion layer, namely, the ratio between the source contact area and the body contact area becomes 1:1.

In addition, since the bar-shaped contact wiring metal layer is formed, and the contacting area between the contact wiring metal layer and the body contact diffusion layer becomes less, the etching ratio becomes similar to that for the contact structures of the other regions.

As described above, the body contact structure of the semiconductor device according to the present invention includes the body contact diffusion layers formed in the extended source regions, and the body contact layers formed on the body contact diffusion layers, so that the body contact diffusion layers and the source region formed therebetween are commonly connected, whereby it is possible to obtain a 1:1 area ratio of the metal contact with respect to the source region and the body contact diffusion layer even when an error occurs when aligning the contact mask. In addition, it is possible to form a small size contact, for thus obtaining a predetermined etching ratio which is similar to that for the contact structures of the other regions.

Therefore, the electric potential difference between the substrate and the source is reduced, for thus preventing the activation of the parasitic device and achieving a more stable operation of the device.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A contact structure, comprising:
   a substrate extending in a first direction;
   a conductive source region formed in the substrate;
   a plurality of conductive body contact diffusion regions formed in the substrate along the first direction separated by the conductive source region, wherein each of said plurality of conductive body contact diffusion regions comprises first and second edges parallel to each other and the first direction, third and fourth edges parallel to each other and angled with respect to the first direction, and fifth and sixth edges parallel to each other and a second direction, the second direction being substantially perpendicular to the first direction; and
   a plurality of wiring contacts, wherein each wiring contact couples two adjacent diffusion regions, and a ratio of contacting surface of the source region with the wiring contacts and the diffusion regions with the wiring contacts is 1-to-1.

2. The contact structure of claim 1 wherein each of the plurality of wiring contacts are cubic-shaped.

3. The contact structure of claim 1, wherein the source region comprises first and second parallel source regions extending along the first direction.

4. The contact structure of claim 3, wherein the diffusions regions are alternately formed in the substrate along the first direction with extended source regions, wherein the diffusion regions and the extended source regions are between the first and second parallel source regions, and wherein the extended source regions couple the first and second parallel source regions.

5. A contact structure, comprising:
   a substrate extending in a first direction;
   a conductive source region formed in the substrate;
   a plurality of conductive body contact diffusion regions formed in the substrate along the first direction separated by the conductive source region, wherein end portions of adjacent diffusion regions are aligned in a second direction, and the second direction is substantially perpendicular to the first direction; and
   a plurality of wiring contacts, wherein each wiring contact couples two adjacent diffusion regions, and a ratio of contacting surface of the source region with the wiring contacts and the diffusion regions with the wiring contacts is 1-to-1.

6. The contact structure of claim 5, wherein each of the plurality of wiring contacts are cubic-shaped.

7. The contact structure of claim 5, wherein the source region comprises first and second parallel source regions extending along the first direction.

8. The contact structure of claim 7, wherein the diffusions regions are alternately formed in the substrate along the first direction with extended source regions, wherein the diffusion regions and the extended source regions are between the first and second parallel source regions, and wherein the extended source regions couple the first and second parallel source regions.

9. A contact structure, comprising:
   a substrate extending in a first direction;
   a conductive source region formed in the substrate;
   a plurality of conductive body contact diffusion regions formed in the substrate along the first direction separated by the conductive source region, wherein end portions of adjacent diffusion regions intersect a line extending along a second direction, and the second direction is substantially perpendicular to the first direction; and
   a plurality of wiring contacts, wherein each wiring contact couples two adjacent diffusion regions, and a ratio of contacting surface of the source region with the wiring contacts and the diffusion regions with the wiring contacts is 1-to-1.

10. The contact structure of claim 9, wherein each of the plurality of wiring contacts are cubic-shaped.

11. The contact structure of claim 9, wherein the source region comprises first and second parallel source regions extending along the first direction.

12. The contact surface of claim 11, wherein the diffusions regions are alternately formed in the substrate along the first direction with extended source regions, wherein the diffusion regions and the extended source regions are between the first and second parallel source regions, and wherein the extended source regions couple the first and second parallel source regions.

* * * * *